United States Patent [19]

Niwa et al.

[11] 3,854,965

[45] Dec. 17, 1974

[54] METHOD OF MANUFACTURE OF ALUMINA SUBSTRATE WITH IMPROVED SMOOTHNESS AND ELECTRICAL PROPERTIES

[75] Inventors: Koichi Niwa; Yoshiharu Anzai, both of Tokyo; Kaoru Hashimoto, Kawasaki; Hiromi Yokoyama, Tokyo, all of Japan

[73] Assignee: Fujitsu Limited, Kawasaki, Japan

[22] Filed: Feb. 22, 1973

[21] Appl. No.: 334,615

[30] Foreign Application Priority Data

Mar. 3, 1972 Japan ............................... 47-22112

[52] U.S. Cl. .................... 106/62, 106/65, 106/73.4

[51] Int. Cl. ........................................... C04b 35/10

[58] Field of Search ........................ 106/62, 65, 73.4

[56] References Cited

UNITED STATES PATENTS

| | | | |
|---|---|---|---|
| 2,966,719 | 1/1961 | Park | 106/73.4 |
| 3,311,482 | 3/1967 | Klingler et al. | 106/65 |
| 3,377,176 | 4/1968 | Wolkodoff et al. | 106/65 |
| 3,698,923 | 10/1972 | Stetson et al. | 106/73.4 |

*Primary Examiner*—J. Poer

*Attorney, Agent, or Firm*—Daniel Jay Tick

[57] ABSTRACT

An alumina substrate with improved surface smoothness and electrical properties is provided by the addition of small quantities of magnesium oxide and chromium oxide to alumina powder, slip casting and firing at a temperature of 1550 to 1670°C.

7 Claims, 6 Drawing Figures

PATENTED DEC 17 1974 3,854,965

SHEET 4 OF 4

METHOD OF MANUFACTURE OF ALUMINA SUBSTRATE WITH IMPROVED SMOOTHNESS AND ELECTRICAL PROPERTIES

BACKGROUND OF THE INVENTION

1. Field of the Invention

The present invention relates to a method of manufacture of an alumina substrate. More particularly, the invention relates to a method of manufacture of an alumina substrate of a type of ceramic useful in electronic device materials and specifically an alumina substrate with a very smooth surface and superior electrical properties.

2. Description of the Prior Art

An alumina substrate is presently widely used as an insulating substrate for a hybrid integrated circuit, a thin film circuit, a microwave integrated circuit, etc. These circuits generally have a conductor pattern or a thin film resistor formed by vacuum evaporated of a conductor material or a resistor material and a thin film condenser formed by the interposition of a dielectric thin film between conductor thin films and the like on the surface of a substrate.

In a thick film circuit, the somewhat rougher surface of the substrate will better improve the adhesion strength of the film and provide better results. Therefore, a substrate with a surface roughness of about 1 to 2 microns in a center line average is frequently used in a thick film circuit. In a thin film circuit, however, which needs a thin film resistor or a thin film condenser of good quality and the like, a very small surface roughness of the substrate is desirable. The surface smoothness has been hitherto obtained by the formation of a glass layer on the alumina substrate surface, or glazing. However, since glass is inferior in thermal conductivity, an alumina substrate under the same condition as fired for a thin film circuit and the like may be utilized in order to provide good thermal radiation.

On the other hand, an alumina substrate with superior electrical properties, and particularly with small dielectric loss (tan$\gamma$), is desired, and this requires a dense alumina substrate with few pores. An alumina substrate may be obtained by the molding and firing of alumina fine powder. The density and surface smoothness of the alumina substrate depend upon casting methods of alumina fine powder, the size of particles and types of alumina fine powder, firing temperatures, and types and quantities of additives.

Slip casting and dry press are included in methods of forming a molding of alumina fine powder, called a green sheet. A slip is produced from alumina powder by slip casting, which casts it in the shape of a sheet. Alumina powder which is made into a slip is generally cast by a method called the Doctor blading method. The Doctor blading method is one in which the slip is flowed in equal thickness on travelling basic substances having surface smoothness, glass boards, or films, by a spatula called a Doctor blade, and casted.

Generally, a green sheet having surface smoothness may be provided by slip casting. However, since solvents, binders, etc., are added in order to make the alumina powder a slip, it is difficult to obtain a dense green sheet. An alumina substrate obtained by the firing of a green sheet, which is dense, is therefore difficult to produce. Dry press is a method for casting alumina powder by a mechanical press, and permits formation of a green sheet having a high density. A dense alumina substrate may be produced by the firing of a green sheet having a high density, produced by a dry press method. However, the smoothness of an alumina substrate produced by the dry press method is generally greatly influenced by that of the surface of the substance on which the press is loaded. It is therefore difficult to provide a smooth surface, such as that of an alumina substrate produced by tape casting.

Alumina powder having particles of about 0.05 to several micrometers in diameter is frequently used in the manufacture of an alumina substrate. There are $\alpha$-alumina and $\gamma$-alumina in the alumina crystal phase. $\gamma$-alumina is higher in activity than $\alpha$-alumina. At the present time, only $\gamma$-alumina is available as alumina powder of very fine grain size. $\alpha$-alumina has a comparatively larger grain size. $\gamma$-alumina is transformed $\alpha$-alumina at a temperature of 1100°C or more, and during such time a growth of very large particles, or an abnormal grain growth occurs. Thus, a smooth alumina substrate cannot be produced even by the casting and firing of $\gamma$-alumina powder.

On the other hand, alumina fine powder having a high activity is preferably used for the manufacture of a fine grain and dense alumina substrate. Pores in a green sheet and a strong combination between particles may be provided at comparatively lower energy, or at comparatively lower temperatures, by the firing of a green sheet produced by the use of alumina fine powder having a high activity.

With regard to the firing temperatures, at higher temperatures, the grain growth becomes larger, a higher densification alumina substrate is obtained and, at the same time, the surface smoothness is lost. For example, when a green sheet from which an alumina substrate having a surface roughness of 0.1 micrometer in a center line average, briefly described as CLA, at a firing temperature of 1600°C is fired at 1700°C, the consequently obtained surface roughness of the alumina substrate reaches 1.0 micron CLA.

Many studies have been made concerning alumina having high purity. It is well known that the growth of alumina particles shows a linear change related to some extent to the firing temperatures, by the addition of a small quantity of magnesium oxide (MgO), and the control of the grain growth is permissible to some extent. For example, the addition of MgO is described in detail on pages 532 to 535 of the Ceramic Bulletin, Vol. 50, No. 6, a periodical in the United States. In this study, however, the green sheet is produced by the dry press method in order to provide fine alumina ceramics, and no regard is paid to the surface smoothness. Temperatures of 1700 to 1800°C are required for firing in wet hydrogen, even when 0.25 weight percent, briefly described as wt %, of MgO is added. The addition of MgO is reported as the most effective way to produce fine alumina ceramics. Large grain growth thus occurs with the firing of the green sheet and a rough surface is obtained on the alumina substrate only because of the large grain growth of the surface. It is also known that hard alumina ceramics are produced by the addition of chromium oxide ($Cr_2O_3$) of about 10 wt %. Such alumina ceramics are utilized for jigs, etc., requiring wearproof characteristics. In such alumina ceramics, however, no regard is paid to the surface smoothness.

Taking the foregoing into consideration, a fine grain alumina substrate having surface smoothness and used as a substrate of a thin film circuit or a microwave integrated circuit, etc., has been hiterto manufactured as follows. α-alumina powder having high purity is made a slip by the addition of solvents, binders, deflocculents and plasticizers. The slip is cast by tape casting, particularly by the Doctor blading method, dried, and a green sheet is formed. The green sheet is fired at a temperature of 1700 to 1800°C to produce an alumina substrate. Hydrogen is frequently ambient when the firing is performed. Therefore, the following substances are generally used when alumina powder is made a slip. Ethyl cellulose, polyvinyl alcohol, polyvinyl chloride, polystyrene acrylate, polyvinyl butyral, or copolymer of vinyl chloride and vinyl acetate, etc., are used as binders. Methyl ethyl ketone (MEK), n-butyl acetate, etc., are used as solvents. Stearic acid, polyoxy ethylene nonyl phenyl ether, lauric tri methyl ammonium chloride, etc., are used as deflocculents. Dioethyl phthalate, butyl benzil phthalate, etc. are used as plasticizers.

An alumina substrate which is dense, but has a rough surface, has been hitherto provided by using α-alumina powder, which produces only a comparatively larger grain size, and by firing at a temperature of 1700°C, or more. The characteristics of a commercially available alumina substrate are generally as follows. Gloss, which indicates the smoothness of the surface of an alumina substrate is 15 to 20, the dielectric loss (tan δ) is about $3 \times 10^{-4}$ (1 MHz), the Te value, which indicates that, at a temperature where the volume resistivity of ceramics becomes $10^6$ ohm-cm, the higher the Te value, the better the quality of a ceramic substrate, is about 950, the specific gravity is about 3.9, and the strength or flexural strength is about 3500 $Kg/cm^2$.

As hereinbefore mentioned, the density of an alumina substrate is in inverse relation to the smoothness of the surface and it is difficult to produce an alumina substrate having both these characteristics.

An object of the invention is to provide a method of manufacture of an alumina substrate which is dense and has a smooth surface. Another object of the invention is to provide a method of manufacture of an alumina substrate suitable for use as an insulating substrate of a hybrid integrated circuit, a thin film integrated circuit and a microwave integrated circuit, in the fired condition.

BRIEF SUMMARY OF THE INVENTION

The methods of the invention are as follows:

1. A method of the invention using alumina powder in which small quantities of magnesium oxide and chromium oxide ($Cr_2O_3$) are added to and mixed with the alumina powder, a green sheet is formed by slip casting and the green sheet is fired at a comparatively low temperature. The method of the invention proves that the addition to and mixture with alumina powder of small quantities of both MgO and $Cr_2O_3$ produces an alumina substrate which is denser and has a smoother surface than alumina powder to which only one of these ingredients is added and mixed. The addition of both MgO and $Cr_2O_3$ is effective in producing an alumina substrate of high density and having a smooth surface for the following reasons. A small quantity of MgO prevents the abnormal grain growth of alumina when fired and produces a uniform and normal grain growth. On the other hand, since $Cr_2O_3$ itself is inferior in electric insulation characteristics, the addition of a large quantity of $Cr_2O_3$ is undesirable in producing an alumina substrate of an insulating substrate.

However, when alumina powder to which a small quantity of $Cr_2O_3$ is added is fired at a comparatively low temperature, the $Cr_2O_3$ diffuses into the alumina grain boundary and exhausts pores between alumina grains. A fine alumina substrate may thus be produced by firing at a comparatively low temperature. Furthermore, when the firing temperature is lower, the alumina grain growth is comparatively smaller, so that an alumina substrate having a smooth surface is produced. When the firing temperature is higher than about 1670°C, a solid solution of alumina and $Cr_2O_3$ is produced and the electrical properties of the alumina substrate are deteriorated. In accordance with the invention, the firing temperature at which $Cr_2O_3$ is fully diffused into the alumina grain boundary and an alumina substrate having a high density and superior electrical properties is produced, is within the range of 1550 to 1670°C. Furthermore, the addition of MgO of 0.1 to 0.4 wt % and $Cr_2O_3$ of 0.001 to 0.05 wt % to alumina powder is adequate. The most desirable alumina substrate is produced by the addition of about 0.25 wt % of MgO and 0.02 to 0.03 wt % of $Cr_2O_3$ and firing at a temperature of about 1600°C.

2. A method of the invention for producing a slip from alumina powder uses the following materials and the slip. The materials used for producing a slip from alumina powder are polyvinyl butyral used as a binder, solubitane tri-oleate used as a deflocculent, dibutyl phthalate used as a plasticizer, and methyl ethyl ketone (MEK), methyl alcohol and n-butyl alcohol used as solvents. These materials, in quantities within the following limits, are added to 100 parts of alumina powder. The materials are 5.5 to 9.5 parts of polyvinyl butyral, (4.0 to 6.0 parts for an average degree of polymerization of 250 to 500 and 1.5 to 3.5 parts for a degree of polymerization of 1000 to 2000), 0.8 to 1.5 parts of solubitane tri-oleate, 0.5 to 1.2 parts of dibutyl phthalate, 20 to 30 parts of MEK, 10 to 20 parts of methyl alcohol, 8 to 12 parts of n-butyl alcohol. These mixing ratios are indicated in weight.

3. A method of the invention uses alumina powder in which γ-alumina powder of 30 wt % or less is added to γ-alumina powder. It has been proven that the use of the mixed powder of α-alumina and γ-alumina improves the smoothness of a green sheet and increases the density of the alumina substrate. When γ-alumina of 30 wt % or more is added, it is difficult to produce a satisfactory slip because of slip casting, since it is impossible to provide a uniform dispersion of alumina powder. The most effective quantity of added γ-alumina powder is about 10 wt %.

The mixed powder in which small quantities of MgO and $Cr_2O_3$ are added to the mixed powder of α-alumina and γ-alumina is made a slip by the addition of the aforedescribed solvents, deflocculents, plasticizers and binders. The slip is made a green sheet by slip casting. The green sheet is fired in hydrogen at a comparatively lower temperature and an alumina substrate is provided. The alumina substrate thus produced has a very smooth surface and a small dielectric loss. In the method of manufacture of the alumina substrate of the invention, the firing of the green sheet in hydrogen is desirable, as before.

The method of the invention is described in detail in the following examples.

BRIEF DESCRIPTION OF THE DRAWINGS

In order that the invention may be readily carried into effect, it will now be described with reference to the accompanying drawings, wherein.

DETAILED DESCRIPTION OF THE INVENTION

Example 1

Figure 1:
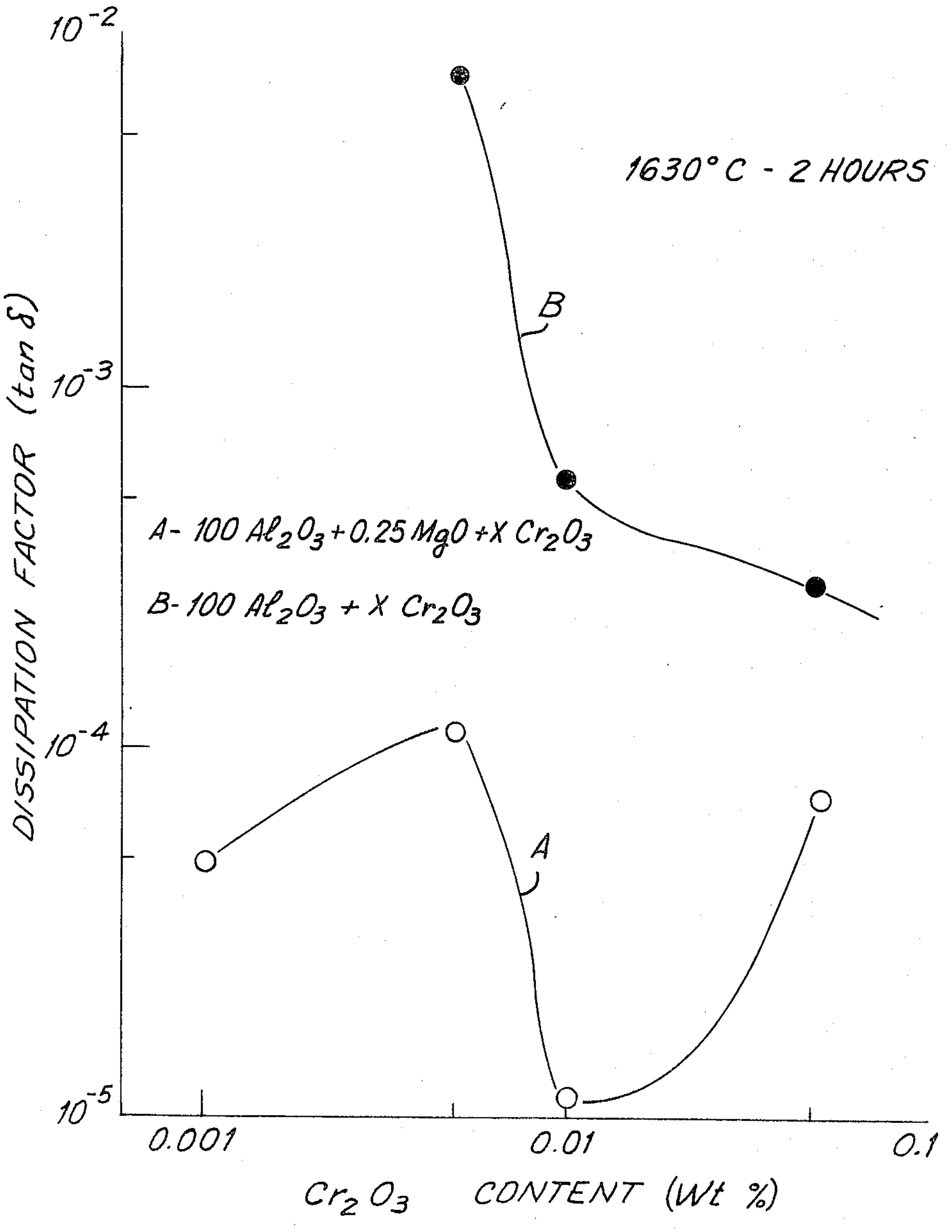
FIG. 1 is a graphical presentation of the relationship of the dissipation factor (tan δ - 10 MHz) of an alumina substrate and the content of $Cr_2O_3$.

Alumina powders, known under the tradenames LINDE A and LINDE C, and manufactured and sold by the Union Carbide Co. of the United States, are prepared. The average grain diameter of LINDE A is 0.3 micron and that of LINDE C is 1.0 micron. These alumina powders consist of γ-alumina having a purity of 99.99% or more. LINDE A and LINDE C are rendered in equivalent weight and are combined. Small quantities of magnesium oxide (MgO) G.R. (Guaranteed Reagent) and chromium oxide ($Cr_2O_3$) G.R. are added to 100 parts of the combined alumina and mixed. Powders of samples 1 to 5 having the following constituents are provided.

| | | |
|---|---|---|
| Sample 1: | Alumina | – 100 parts by weight |
| | MgO | – 0.25 part by weight |
| | $Cr_2O_3$ | – 0 part by weight |
| Sample 2: | Alumina | – 100 parts by weight |
| | MgO | – 0.25 part by weight |
| | $Cr_2O_3$ | – 0.001 part by weight |
| Sample 3: | Alumina | – 100 parts by weight |
| | MgO | – 0.25 part by weight |
| | $Cr_2O_3$ | – 0.005 part by weight |
| Sample 4: | Alumina | – 100 parts by weight |
| | MgO | – 0.25 part by weight |
| | $Cr_2O_3$ | – 0.01 part by weight |
| Sample 5: | Alumina | – 100 parts by weight |
| | MgO | – 0.25 part by weight |
| | $Cr_2O_3$ | – 0.05 part by weight |

The foregoing samples of combination ratios are all indicated by weight. Samples 1 to 5 are produced as alumina substrates, as follows. Deflocculents, plasticizers, solvents and binders are added in order to make the mixed powders of the foregoing samples a slip. The process for making a slip is described in detail as follows.

100 parts of the mixed powder is placed in a mill pot made of polyethylene. A deflocculent, a plasticizer and solvents are added in the following parts, by weight.

The deflocculent is 1 part by weight of solubitane trioleate. The plasticizer is 10 parts by weight of dibutyl phthalate. The solvent is 25 parts by weight of methyl ethyl ketone (MEK), 15 parts by weight of methyl alcohol and 10 parts by weight of n-butyl alcohol.

An ingredient, known under the tradename OP-85R, manufactured and sold by the Nippon Oils and Fats Co., Ltd. of Japan, is used as the solubitane tri-oleate deflocculent.

Alumina balls are placed in the mill pot with the aforedescribed materials. The mill pot is rotated at a speed of 100 to 120 rpm for 24 hours and the aforedescribed materials are fully milled and mixed. Since wear of the alumina balls due to the rotation of the mill pot is inevitable, alumina balls having a purity of 99.5% or more are used. When about half the mill pot is filled with alumina balls, each having a diameter of 1.5 to 2 cm., the pot is effectively stirred. A binder of the following ingredients is placed in the mill pot. The binder includes 5.5 parts of polyvinyl butyral for an average degree of polymerization of 250 to 550 and 3.0 parts of polyvinyl butyral for an average degree of polymerization of 1000 to 2000.

The mill pot, to the ingredients of which the binder is added is additionally rotated for 24 hours. Five parts of MEK and 2 parts of methyl alcohol are added as solvents. The mill pot is additionally rotated for another 24 hours and the slip is produced. The slip is separated from the alumina balls and moved to another vessel. The slip is then filtered through a filter having an average pore diameter of 300 microns. Moreover, the slip is placed in a vacuum, bubbles in it are removed, and the solvents are simultaneously evaporated, so that solid contents of the slip are about 63%. The slip is then completed.

The slip is cast in the following process. First, polyester film having a smooth surface, such as, for example, Mylar film S type manufactured and sold by the Dupont Company of the United States, is prepared. The slip is flowed in uniform thickness on the polyester film by the Doctor blading method. The film is transported at a speed of 2m/min. The flowed slip is 20 cm in width and 0.8 mm in thickness. The slip, flowed in sheet shape, is left and dried in a room for 24 hours. The strip is then stripped from the polyester film. The green sheet is then completed.

The green sheet is cut out in the dimensions of 10 cm × 10 cm and is heated in air for the removal of the binder from the green sheet. The green sheet is heated to remove the binder in the following manner. The green sheet is placed in a furnace. The temperature of the furnace is raised to 1300°C at a gradient of 80°C/hour and is held at a temperature of 1300°C for an hour. Thereafter, the heating is terminated and the green sheet is left in the furnace and slowly cooled.

Firing is provided by placing the green sheet, from which the binder has been removed, in a hydrogen atmosphere for 2 hours at a temperature of 1630°C. The alumina substrate is completed.

The smoothness of the surface, the dissipation factor (tan δ), the value of Te, the specific gravity and the mechanical strength of the alumina substrate of the invention have been measured. The smoothness of the surface is indicated by the gloss. The gloss is represented by the ratio (%) of the intensity of reflected light when light is irradiated from the surface of plate glass having an index of refraction of 1.567 to the intensity of reflected light when similar light is irradiated from the specimen. Suitable measuring apparatus is, for example, Gloss Meter GM-100, manufactured and sold by the Murakami Color Research Laboratory of Japan. In this example, the aforedescribed measuring apparatus was used. The dissipation factor (tan δ) is the value measured at 10 MHz by the well known bridge method. The flexural strength is measured as the mechanical strength. The results are shown in Table 1.

Figure 3:
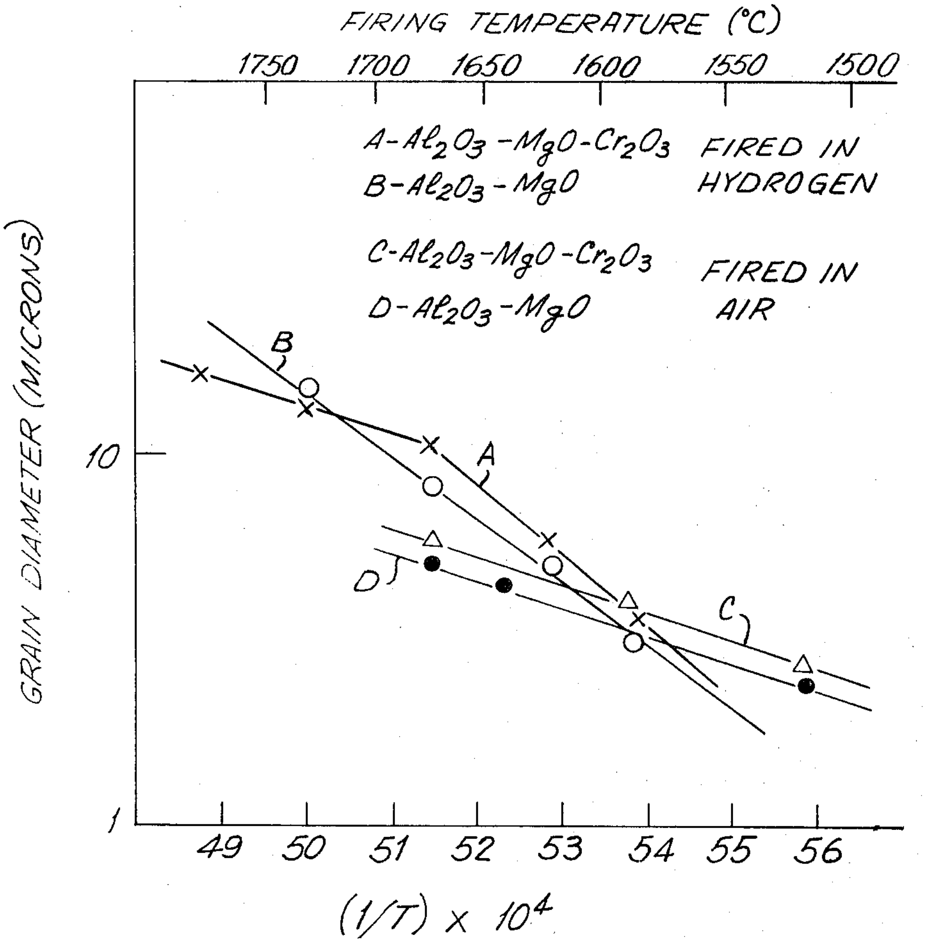
FIG. 3 is a graphical presentation of the relationship of the grain diameter of an alumina substrate and the firing temperature.

Alumina powder is which LINDE A and LINDE C are equivalently mixed is prepared. The average grain diameter of the alumina powder is 0.7 micron. A specimen is prepared of an $Al_2O_3$-MgO mixture in which MgO of 0.25 wt % is added to the alumina powder and of an $Al_2O_3$-MgO-$Cr_2O_3$ mixture in which MgO of 0.25 wt % and $Cr_2O_3$ of 0.01 wt % are added to the alumina powder. The green sheets of these specimens are produced by the aforedescribed process for making a slip, casting and removing the binders. The green sheets are produced as alumina substrates by being fired at various temperatures within the range of temperatures of 1500 to 1750°C. The firing of each specimen is provided in each case in both an atmosphere of air and an atmosphere of hydrogen. The alumina grain diameter of the fired alumina substrate was measured, and the results are shown in FIG. 3.

TABLE 1

| SAMPLE | GLOSS | TAN δ (10 MHz) | Te VALUE | SPECIFIC GRAVITY | FLEXURAL STRENGTH (Kg/cm²) |
|---|---|---|---|---|---|
| 1 | 42 | $7.5 \times 10^{-5}$ | 1000 | 3.93 | 3450 |
| 2 | 52 | $5.5 \times 10^{-5}$ | 990 | 3.96 | 3240 |
| 3 | 61 | $1.0 \times 10^{-4}$ | 1130 | 3.95 | 3080 |
| 4 | 63 | $1.2 \times 10^{-5}$ | 1230 | 3.97 | 3470 |
| 5 | 58 | $6.9 \times 10^{-5}$ | 1360 | 3.94 | 3280 |

From Table 1, it is clear that the alumina powders of Samples 2 to 5, in which both MgO and $Cr_2O_3$ are added and mixed, provide an alumina substrate having a smoother surface than the alumina powder of Sample 1, to which only MgO is added. Furthermore, than δ, the value of Te, the specific gravity and the strength of Samples 2 to 5 are equivalent to those of Sample 1 and of prior alumina substrates. Therefore, when alumina powder having $Cr_2O_3$ of 0.001 to 0.05 wt % added thereto is used, it is proven that an alumina substrate having a smooth surface is produced.

On the other hand, alumina substrate has been produced, including the mixed powder of LINDE A and LINDE C equivalents and $Cr_2O_3$ of 0.005 to 0.05 wt %. Such an alumina substrate is very inferior, since it has a dissipation factor of $3 \times 10^{-4}$ to $10^{-2}$ at 10 MHz, and is unsuitable as an insulating substrate of a thin film circuit, etc. The variation of the value of the dissipation factor with the variation of added quantities of $Cr_2O_3$ is shown in FIG. 1. It is evident from FIG. 1 that the dissipation factor, shown by the curve A, of an alumina substrate to which both MgO and $Cr_2O_3$ are added is very superior to the dissipation factor, shown by the curve B, of an alumina substrate to which only $Cr_2O_3$ is added. It is therefore evident that the added MgO acts effectively on the density of the alumina substrate. It is well known that the added quantity of MgO is the most effective at 0.25 wt %, but it is effective enough within the range of 0.1 to 0.4 wt %.

Figure 2:
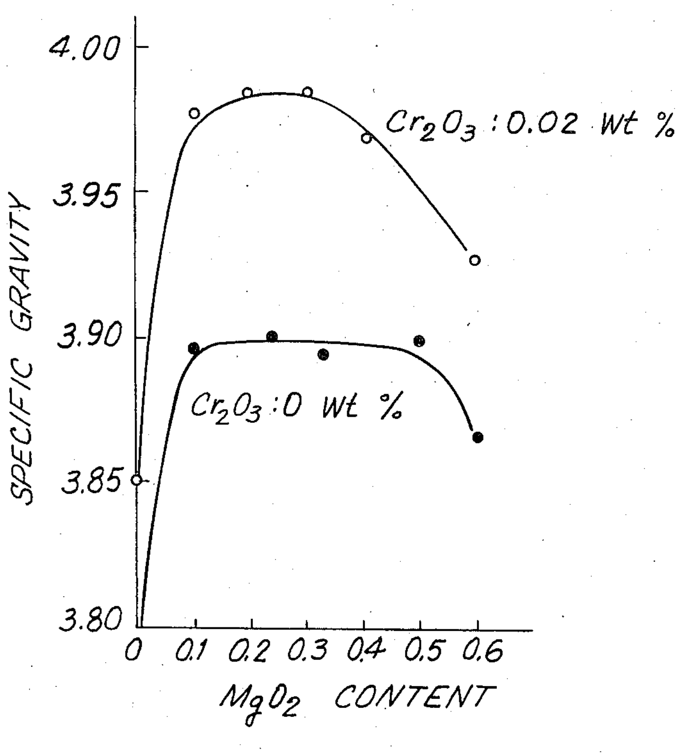
FIG. 2 is a graphical presentation of the relationship of the specific gravity of an alumina substrate and the content of MgO.

In this example, alumina substrates having various different alumina powders including MgO within the range of 0 to 0.6 wt % have been produced and the specific gravity has been investigated. The results are shown in FIG. 2. FIG. 2 shows the relationship of the specific gravity of two types of alumina substrates having $Cr_2O_3$ contents of 0 and 0.02 wt % and the content of MgO. It is evident from FIG. 2 that, even when $Cr_2O_3$ is added, the addition of MgO in the range of 0.1 to 0.4 wt % is effective on producing a dense alumina substrate.

In order to determine why the addition of $Cr_2O_3$ is effective on providing a smooth alumina substrate, the alumina grain growth has been investigated as follows.

In a comparison of the curve A and the curve B of FIG. 3, it is clearly seen that the alumina of an $Al_2O_3$-MgO-$Cr_2O_3$ mixture produces the characteristic grain growth. Specifically, the alumina of an $Al_2O_3$-MgO-$Cr_2O_3$ mixture shows a variation in the ratio of the grain growth to the firing temperature near a temperature of 1670°C. It is considered that this is due to the following. $Cr_2O_3$ diffuses between the alumina particles at a temperature of about 1670°C or less. Specifically, grain boundary diffusion occurs. Furthermore, at a temperature of about 1670°C or more, a solid solution of $Cr_2O_3$ and alumina ($Al_2O_3$) is produced, and there is a variation in the grain growth ratio. It is considered that the grain boundary diffusion effects the smoothness of the surface of the alumina substrate and the solid solution of $Cr_2O_3$ and $Al_2O_3$ increases the dissipation factor of the alumina substrate. Therefore, the firing temperature of about 1670°C or less is considered to be adequate.

In the foregoing example, the alumina substrate of an $Al_2O_3$-MgO-$Cr_2O_3$ mixture produced by various variations in the firing temperature has a comparatively smaller dissipation factor and a very smooth surface at firing temperatures within the range of 1550 to 1670°C.

It is noticed that the value of the dissipation factor and the gloss of an alumina substrate produced from alumina of an $Al_2O_3$-MgO mixture, or Sample 1 in the foregoing example, are superior from the value of the dissipation factor of about $3 \times 10^{-4}$ and the value of the gloss of 15 to 20 of alumina substrates presently commercially available. This is due to the superior combination of deflocculents, plasticizers, solvents and binders for making alumina powder a slip in the foregoing example. The following experiment explains the superiority of such combination.

Experiment 1

LINDE A and LINDE C are equivalently prepared and mixed. The average grain diameter of the mixed alumina powder is 0.7 micron. MgO of 0.25 wt % is added to the alumina powder and mixed. The alumina powder of an $Al_2O_3$-MgO mixture is equally divided and is made into the following two types of slips. The combination ratios are all indicated by weight.

Sample 6

The following deflocculent and solvent are added to the aforedescribed alumina powder of 100 parts of an $Al_2O_3$-MgO mixture. The deflocculent is 1.0 part by weight of solubitane tri-oleate. The solvent is 30 parts by weight of MEK, 20 parts by weight of methyl alcohol and 10 parts by weight of n-butyl alcohol.

The resultant mixture is mixed by a ball mill for 24 hours. Then, a plasticizer of 10 parts by weight of dibutyl phthalate and a binder of 5.5 parts by weight of polyvinyl butyral for an average degree of polymerization of 250 to 500 and 3.0 parts by weight of polyvinyl butyral for an average degree of polymerization of 1000 to 2000 are added. The resultant mixture is further mixed by a ball mill for 48 hours. The slip of Sample 6 is then completed.

Sample 7

The following deflocculent and solvent are added to the above alumina powder of 100 parts of an $Al_2O_3$-MgO mixture. The deflocculent is 1.6 parts by weight of stearic acid. The solvent is 20 parts by weight of toluene and 30 parts by weight of MEK.

The resultant mixture is mixed by a ball mill for 24 hours. The following plasticizer and binder are added. The plasticizer is 5 parts by weight of dibutyl phthalate. The binder is 8.2 parts by weight of copolymer of vinyl chloride and vinyl acetate. The resultant mixture is further mixed by a ball mill for 48 hours and the slip of Sample 7 is completed. Specifically, Sample 6 is made a slip by the method of the invention and Sample 7 is made a slip by the prior known methods.

The slips of Samples 6 and 7 are debubbled, dried and flowed on Mylar film by the Doctor blading method and a green sheet is produced in the same manner as in Example 1. The green sheets, from which the binder is removed, are fired at three temperatures of 1600°C, 1650°C and 1700°C in an atmosphere of hydrogen for 2 hours and become alumina substrates.

The gloss, tanδ, the value of Te, the specific gravity and the flexural strength have been measured for these alumina substrates in the same manner as in Example 1. The results are shown in Table 2.

TABLE 2

| SAMPLE | FIRING TEMPERATURE(°C) | GLOSS | TAN δ (1MHz) | TE VALUE | SPECIFIC GRAVITY | FLEXURAL STRENGTH (Kg/cm²) |
|---|---|---|---|---|---|---|
| 6 | 1600 | 44 | $1.2 \times 10^{-4}$ | 970 | 3.90 | 3350 |
| | 1650 | 40 | $5.2 \times 10^{-5}$ | 1020 | 3.95 | 3540 |
| | 1700 | 29 | $8.5 \times 10^{-5}$ | 1070 | 3.97 | 3580 |
| 7 | 1600 | 31 | $2.4 \times 10^{-4}$ | 940 | 3.89 | 3350 |
| | 1650 | 25 | $6.3 \times 10^{-5}$ | 1000 | 3.94 | 3530 |
| | 1700 | 22 | $8.6 \times 10^{-5}$ | 1060 | 3.97 | 3580 |

From Table 2, it is evident that the gloss of the alumina substrate obtained from Sample 6 is superior to that of the alumina substrate obtained from Sample 7. It is also evident that the alumina substrates of Samples 6 and 7 have a nearly equivalent dissipation factor, Te value, specific gravity and strength. Therefore, it is clear that alumina powder made a slip by the use of a deflocculent of solubitane tri-oleate, a solvent of MEK, methyl alcohol and n-butyl alcohol, a plasticizer of dibutyl phthalate and a binder of polyvinyl butyral provides an alumina substrate having a very smooth surface.

A deflocculent of solubitane tri-oleate uniformly diffuses alumina particles. The types of polyvinyl butyral are usually divided according to the degree of polymerization. Polyvinyl butyral used as a binder in the method of the invention is butyral having degrees of polymerization covering a wide range by a combination of higher degrees of polymerization of 1000 to 2000 and lower degrees of polymerization of 250 to 200, and produces a green sheet with strong caking power and flexibility. Dibutyl phthalate ia a plasticizer added to compensate for insufficient plasticity of a green sheet produced by the addition of a binder only. The ingredient n-butyl alcohol slows down a rapid evaporation of solvents when the slip is dried. The allowable range of the combination ratio, by weight, for 100 parts of alumina in which these materials may function sufficiently as deflocculent, binder, plasticizer and solvent is as follows.

| | |
|---|---|
| Solubitane tri-oleate | – 0.8 to 1.5 parts by weight |
| MEK | – 20 to 30 parts by weight |
| Methyl alcohol | – 10 to 20 parts by weight |
| n-butyl alcohol | – 8 to 12 parts by weight |
| Dibutyl phthalate | – 0.5 to 1.2 parts by weight |
| Polyvinyl butyral | – 4.0 to 6.0 parts by weight |

for an average degree of polymerization of 250 to 500 and 1.5 to 3.5 parts by weight for an average degree of polymerization of 1000 to 2000.

A superior green sheet may be cast by a combination in the foregoing range.

In accordance with the invention, the use of alumina powder in which α-alumina and γ-alumina are mixed is effective in providing a dense alumina substrate having a smooth surface. An experiment concerning the use of γ-alumina is as follows.

Experiment 2

A γ-alumina powder having a purity of 99.99% and an average grain diameter of 0.05 micron or less is prepared. The γ-alumina powder is heated in air at a temperature of 1300°C for 1 hour and becomes α-alumina. Heating at a temperature of 1100 to 1200°C cannot provide complete α-alumina unless sufficient time is allocated. Furthermore, when the heating temperatures are too high, abnormal grain growth occurs. The heating temperatures should therefore be 1300°C ± 10°C.

The grain diameter of α-alumina thus produced has a broad average distribution of 0.1 to 0.3 micron. 0 to 30 wt % of the aforedescribed γ-alumina powder is added to the α-alumina powder and 0.25 wt % of MgO is added in order to produce normal grain growth. A deflocculent of solubitane tri-oleate, a solvent of MEK, methyl alcohol and n-butyl alcohol, a plasticizer of dibutyl phthalate and a binder of polyvinyl butyral are added to the produced mixed powder. The resultant mixture is mixed in a ball mill for 72 hours and provides a slip.

The slip is cast in the same manner as in Example 1, and a green sheet is produced. The gloss of the surface of the green sheet surface has been measured. The binder is removed from the green sheet by the same heating process as in Example 1, and the green sheet is fired in wet hydrogen at a temperature of 1600°C for 1 hour. The specific gravity and the coefficient of shrinkage or the ratio of the volume contracted by the firing to the volume of the green sheet, have been measured in the alumina substrate produced by the firing. The results are shown in FIGS. 4 and 5.

Figure 4:
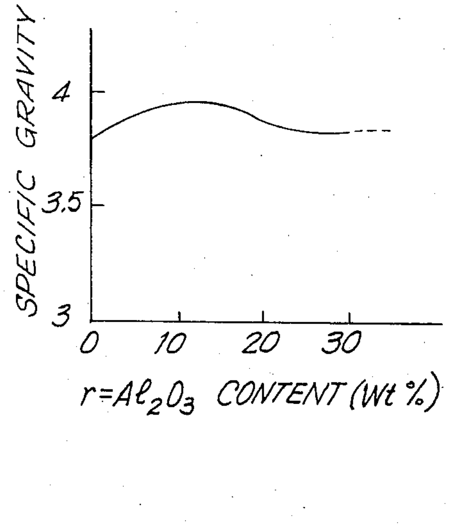
FIG. 4 is a graphical presentation of the relationship of the specific gravity of an alumina substrate after firing and the γ-alumina content of alumina powder.
Figure 5:
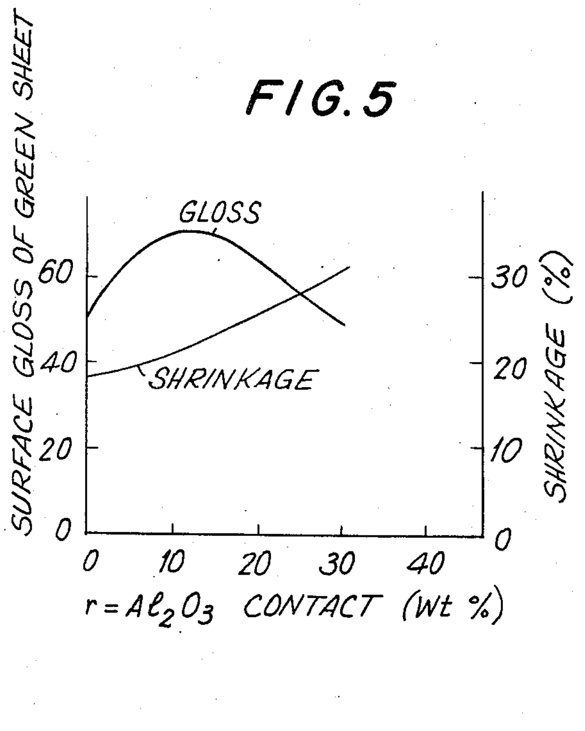
FIG. 5 is a graphical presentation of the relationship of the gloss of the green sheet surface and the γ-alumina content of alumina powder, and the coefficient of shrinkage at the time of firing.

FIG. 4 shows the specific gravity of an alumina substrate having a γ-alumina content. FIG. 5 shows the gloss of a green sheet having a γ-alumina content and the coefficient of shrinkage when fired. It is evident from FIGS. 4 and 5 that the use of a mixed powder of α-alumina and γ-alumina is effective in producing an alumina substrate of high density having a smooth surface. An especially effective content of γ-alumina is about 10 wt. %. The gloss of the surface of an alumina substrate having a content of 10 wt % of γ-alumina is 49. Alumina powder to which 30 wt % or more of γ-alumina powder is added cannot produce a superior slip. This is due to the non-uniform diffusion of the alumina powder in the slip.

In another embodiment of the method of the invention, the most superior alumina substrate is produced. This embodiment is as follows.

Example 2

A γ-alumina powder having an average grain diameter of 0.05 micron or less and a purity of 99.99% or more, is prepared. The γ-alumina powder is placed in a box comprising alumina having a purity of 95% or more, placed in a furnace in air at a temperature of 1300°C for 1 hour, and is transformed to α-alumina powder. The average grain diameter of the α-alumina powder is 0.3 micron or less. 10 parts by weight of the γ-alumina powder are added to 90 parts by weight of the α-alumina powder. 0.25 wt % of MgO (G.R.) 0.02 wt % of $Cr_2O_3$ (G.R.) are added to the mixed powder. The following materials are added to 100 parts by weight of the mixed powder and the mixture is mixed in a ball mill for 24 hours. Alumina balls having a purity of 99.5% or more are used in the ball mill. The deflocculent is 1 part by weight of solubitane tri-oleate. The plasticizer is 10 parts by weight of dibutyl phthalate. The solvent is 15 parts by weight of MEK, 10 parts by weight of methyl alcohol and 10 parts by weight of n-butyl alcohol.

The following binder is added to the resultant mixture and the total mixture is again mixed in a ball mill for 24 hours. The binder is 5.5 parts by weight of polyvinyl butyral for an average degree of polymerization of 250 to 500 and is 2.0 parts by weight of polyvinyl butyral for an average degree of polymerization of 1000 to 2000. The following solvent is then added to the mixture and the mixture is mixed in a ball mill for 24 hours. The solvent is 5 parts by weight of MEK and 2 parts by weight of methyl alcohol. The slip is then completed.

In the same procedure as in Example 1, the slip provides a green sheet and the binder is removed from the green sheet. The green sheet produces an alumina substrate by being fired in hydrogen at a temperature of 1600°C for 2 hours. The alumina substrate has a gloss of 68, a tan δ of $5.3 \times 10^{-5}$ (1MHz), a Te value of 1280, a specific gravity of 3.98, and a flexural strength of 5120 Kg/cm², and is superior to prior alumina substrates.

Figure 6:
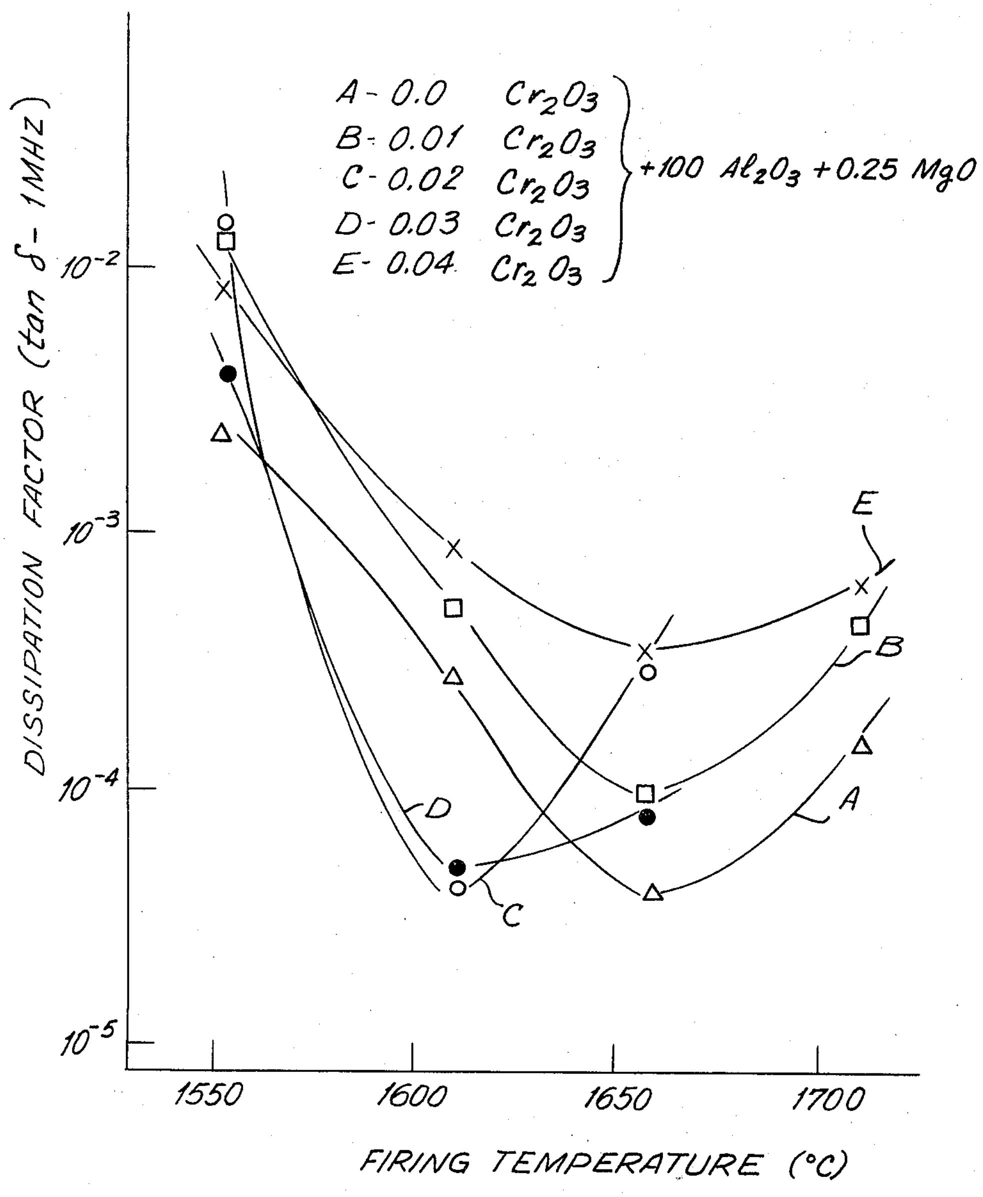
FIG. 6 is a graphical presentation of the relationship of the dissipation factor (tan δ - 1 MHz) of an alumina substrate and the firing temperature.

Various alumina substrates having different contents of $Cr_2O_3$ and MgO have been produced under different conditions in Example 2 and the characteristics of the alumina substrates have been measured. FIG. 6 shows the relationship of the value of the dissipation factor (tanδ-1 MHz) and the firing temperature. In FIG. 6, it is evident that alumina powder containing 0.02 to 0.03 wt % of $Cr_2O_3$ and a small quantity of MgO produces an alumina substrate having a small dissipation factor by firing at a comparatively low temperature of approximately 1600°C. The gloss, dissipation factor (tanδ-1 MHz), Te value, specific gravity and flexural strength (Kg/cm²) of the alumina substrates of Samples 8 to 11 for variations of the firing temperature are shown in Table 3.

TABLE 3

| SAMPLE | FIRING TEMP. (°C) | GLOSS | TAN δ (1MHz) | Te VALUE | SPECIFIC GRAVITY | FLEXURAL STRENGTH (Kg/cm²) |
|---|---|---|---|---|---|---|
| 8 | 1570 | 70 | $1.6 \times 10^{-2}$ | 990 | 3.76 | 2910 |
| 9 | 1600 | 68 | $5.3 \times 10^{-5}$ | 1280 | 3.98 | 5120 |
| 10 | 1650 | 62 | $2.1 \times 10^{-4}$ | 1480 | 3.99 | 5790 |
| 11 | 1700 | 60 | not measured | 1520 | 3.97 | 4400 |

The alumina substrates of Samples 8 to 11 use alumina powder containing MgO of 0.25 wt % and $Cr_2O_3$ of 0.02 wt % and are fired in an atmosphere of hydrogen. Specifically, the alumina substrates of Samples 8 to 11 are produced by variations of the firing temperatures only in the process of Example 1. Furthermore, an alumina substrate produced in a firing atmosphere of air in Example 2 has a gloss of 58, a tan (1 MHz) of $2.5 \times 10^{-4}$, a Te value of 1270, a specific gravity of 3.85, and a flexural strength of 3060 Kg/cm². Therefore, as is well known, an alumina substrate fired in hydrogen is of better quality than an alumina substrate fired in air.

While the invention has been described by means of specific examples and in specific embodiments, we do not wish to be limited thereto, for obvious modifications will occur to those skilled in the art without departing from the spirit and scope of the invention.

We claim:

1. A method of manufacture of an alumina substrate with improved surface smoothness and electrical properties, comprising the steps of making a mixture powder containing magnesium oxide of 0.1 to 0.4 wt %, chromium oxide of 0.001 to 0.05 wt % and a remainder of alumina powder;

producing a slip from the mixture powder;

forming a green sheet by casting the slip; and firing the green sheet at a temperature in the range of 1550 to 1670°C.

2. A method of manufacture of an alumina substrate as claimed in claim 1, wherein the green sheet is fired in hydrogen.

3. A method of manufacture of an alumina substrate as claimed in claim 1, wherein the slip is produced from the alumina powder by the addition of a deflocculent, a solvent of methyl ethyl ketone, methyl alcohol and n-butyl alcohol, a plasticizer of dibutyl phthalate, and a binder of polyvinyl butyral.

4. A method of manufacture of an alumina substrate as claimed in claim 1, wherein the alumina powder consists of $\gamma$-alumina powder of 30 wt % or less and residual $\alpha$-alumina powder.

5. A method of manufacture of an alumina substrate as claimed in claim 1, wherein magnesium oxide of 0.25 wt. % and chromium oxide of 0.02 to 0.03 wt % are added to the alumina powder and the green sheet is fired at a temperature of 1600°C.

6. A method of manufacture of an alumina substrate as claimed in claim 1, wherein the slip is produced by adding to 100 parts by weight of alumina powder, 0.8 to 1.5 parts by weight of a deflocculent, a solvent of 20 to 30 parts by weight of methyl ethyl ketone, 10 to 20 parts by weight of methyl alcohol and 8 to 12 parts by weight of n-butyl alcohol, a plasticizer of 0.5 to 1.2 parts by weight of dibutyl phthalate and a binder of 5.5 to 9.5 parts by weight of polyvinyl butyral.

7. A method of manufacture of an alumina substrate as claimed in claim 4, wherein $\gamma$-alumina powder of 10 wt % is added.

* * * * *